(12) United States Patent
Schade

(10) Patent No.: US 11,474,142 B2
(45) Date of Patent: Oct. 18, 2022

(54) OPTICAL INSULATION-MONITORING DEVICE AND METHOD FOR USING AND PRODUCING SAME

(71) Applicant: Fraunhofer-Gesellschaft Zur Förderung Der Angewandten Forschung E.V., Munich (DE)

(72) Inventor: Wolfgang Schade, Goslar (DE)

(73) Assignee: Fraunhofer-Gesellschaft Zur Forderung Der Angewandten Forschung E.V., Munich (DE)

( * ) Notice: Subject to any disclaimer, the term of this patent is extended or adjusted under 35 U.S.C. 154(b) by 193 days.

(21) Appl. No.: 16/515,763

(22) Filed: Jul. 18, 2019

(65) Prior Publication Data
US 2019/0339322 A1    Nov. 7, 2019

Related U.S. Application Data

(63) Continuation of application No. PCT/EP2018/050979, filed on Jan. 16, 2018.

(30) Foreign Application Priority Data

Jan. 19, 2017  (DE) .................. DE10 2017 200 840

(51) Int. Cl.
*H01B 7/32* (2006.01)
*G01R 31/12* (2020.01)

(52) U.S. Cl.
CPC ..... *G01R 31/1218* (2013.01); *G01R 31/1272* (2013.01); *H01B 7/32* (2013.01)

(58) Field of Classification Search
CPC ........... G01R 31/1218; G01R 31/1272; G01R 31/58; H01B 7/32; G01N 21/952
See application file for complete search history.

(56) References Cited

U.S. PATENT DOCUMENTS

| 5,481,633 A | 1/1996 | Mayer |
| 6,559,437 B1 | 5/2003 | Pope et al. |
| (Continued) | | |

FOREIGN PATENT DOCUMENTS

| CN | 204117620 U | 1/2015 |
| CN | 205508498 U | 8/2016 |
| (Continued) | | |

OTHER PUBLICATIONS

International Search Report for International Patent Application No. PCT/EP2018/050979 dated May 9, 2018.

*Primary Examiner* — Feba Pothen
(74) *Attorney, Agent, or Firm* — Alix, Yale & Ristas, LLP

(57) ABSTRACT

The invention relates to an optical insulation monitoring device for power cables, having at least one optical waveguide for transmitting an optical signal integrated into a polymer film. The polymer film is arranged in such a way that the radially outer surface of the cable is surrounded by the polymer film in at least one longitudinal portion of the cable. At least some of the optical waveguides can be designed as multimode waveguides. The optical waveguides may be integrated in a plurality of layers in the polymer film, the optical waveguides of a first layer being arranged in staggered fashion with respect to the optical waveguides of a second layer arranged above or below the first layer. In this way, at least a section of the polymer film in the film plane is completely covered by the optical waveguides without any unwanted crosstalk between adjacent optical waveguides resulting.

18 Claims, 2 Drawing Sheets

(56) References Cited

U.S. PATENT DOCUMENTS

| | | | |
|---|---|---|---|
| 7,142,291 B2 | 11/2006 | Sarkozi et al. | |
| 7,154,081 B1 | 12/2006 | Friedersdorf et al. | |
| 8,405,640 B2 | 3/2013 | Ebner et al. | |
| 9,297,708 B1 * | 3/2016 | Morris | G01M 5/0091 |
| 9,391,700 B1 | 7/2016 | Bruce et al. | |
| 9,437,350 B2 | 9/2016 | Nexans | |
| 2003/0206111 A1 * | 11/2003 | Gao | G01R 31/1272 |
| | | | 340/635 |
| 2005/0184738 A1 | 8/2005 | Weaver | |
| 2005/0244116 A1 * | 11/2005 | Evans | G01M 11/086 |
| | | | 385/110 |
| 2007/0230863 A1 | 10/2007 | Fukuda et al. | |
| 2010/0226609 A1 | 9/2010 | Tokushima | |
| 2010/0277329 A1 | 11/2010 | Worzyk | |
| 2013/0187630 A1 | 7/2013 | Beinhocker | |
| 2013/0335102 A1 | 12/2013 | Chirgwin et al. | |
| 2015/0009320 A1 * | 1/2015 | Klein | G01M 11/30 |
| | | | 348/128 |
| 2015/0122542 A1 * | 5/2015 | Wenger | G02B 6/001 |
| | | | 174/70 R |
| 2018/0081081 A1 | 3/2018 | Schade et al. | |
| 2018/0180658 A1 * | 6/2018 | Godfrey | G01L 1/242 |

FOREIGN PATENT DOCUMENTS

| | | |
|---|---|---|
| EP | 0 539 915 A1 | 5/1993 |
| EP | 1 712 942 A1 | 10/2006 |
| WO | 02/071111 A2 | 9/2002 |
| WO | 2012/134301 A1 | 10/2012 |
| WO | 2013/148630 A1 | 10/2013 |

* cited by examiner

OPTICAL INSULATION-MONITORING DEVICE AND METHOD FOR USING AND PRODUCING SAME

RELATED APPLICATIONS

This application is a continuation of international patent application PCT/EP2018/050979 filed Jan. 16, 2018, the entire contents of which are incorporated by reference, which claims priority under 35 USC § 119 to German patent application No. 102017200840.7 filed on Jan. 19, 2017. The subject matter disclosed in that application is hereby expressly incorporated into the present application in its entirety.

FIELD OF THE DISCLOSURE

The invention relates to an optical insulation-monitoring device for power cables, comprising an optical waveguide for transmitting an optical measurement signal, an insulation-monitoring apparatus and a cable having such an optical insulation-monitoring device as well as the use thereof and a method for producing same.

BACKGROUND

In power supply grids, insulation-monitoring devices monitor the insulation status of power cables in an earthed three-phase industrial mains supply network and generate an alarm signal if the insulation resistance falls below a minimum value. A TN-system or a TT-system with earthed neutral point is a type of implementation of a low-voltage network for the electrical power supply in the field of electrical engineering with increased reliability in the event of ground faults.

Application areas of insulation-monitoring devices are the monitoring of power supplies where a simple fault, e.g. a single-phase ground fault, may not lead to a failure of the power supply. Examples of power supplies of this type are hospitals, power plants, photovoltaic systems or electromobility. In particular in the case of fast-charging stations for electric vehicles, particularly high safety requirements must be met since charging voltages of up to 950 V and currents of up to 500 A are used.

In particular, special safety requirements are made on fast-charging cables which are used to "refuel" electric vehicles. Here, Security Integrated Level 3 (SIL 3) based on DIN 61508 must be complied with. This means that the system must be able to detect a defect of the standard insulation-monitoring device and subsequently undertake the insulation-monitoring. This means that redundancy of the existing insulation-monitoring system must be provided.

It is known to monitor the insulation of power cables, e.g. a charging cable, by wrapping the charging cable with an optical waveguide, e.g. a glass or polymer fiber. For this purpose, light is coupled into the optical waveguide as an optical measurement signal at a light receiving end and the transmission of the optical measurement signal is detected at the light emitting end of the optical waveguide. Bending of the charging cable changes the light intensity transmitted. If the optical waveguide is completely destroyed, the light conduction is interrupted. These signal changes can be detected and evaluated with a photodiode being arranged at the light emitting end of the optical waveguide. In this case, minor damage to the insulation of the power cable (i.e. the cable sheath) and the penetration, for example, of a nail between individual wraps formed by the optical waveguide, cannot be clearly detected since the fiber forming the optical waveguide is not necessarily completely destroyed, although the insulation can be significantly damaged. In particular, if the light transmission through the optical waveguide is not completely blocked, damage to the insulation cannot be clearly distinguished from transmission losses caused by bending the charging cable.

The object of the present invention is to provide an insulation-monitoring device and a method for producing and using same, which allows improved detection of damage to the insulation of a cable.

SUMMARY OF THE INVENTION

In one aspect, the invention relates to a cable comprising at least one conductor being surrounded by at least one insulation, said cable comprising further an optical insulation-monitoring device, said insulation-monitoring device comprising a plurality of optical waveguides each having a light receiving end and a light emitting end and being adapted to transmit a respective optical measurement signal from said light receiving end to said light emitting end, wherein the optical waveguides are integrated into a polymer film and the polymer film is arranged in such a way that the radially outer surface of the cable is surrounded by the polymer film in at least one longitudinal portion of the cable.

According to one embodiment of the invention, an optical insulation-monitoring device for power cables is provided comprising a plurality of optical waveguides for transmitting at least one optical measurement signal each, the optical waveguides being integrated into a polymer film. The optical insulation-monitoring device is thus formed by a polymer film with integrated optical waveguides. In some embodiments of the invention, at least some of the optical waveguides can be designed as multimode waveguides.

Damage to the insulation of the power cable can be clearly detected by means of the insulation-monitoring device according to the invention. Although bending of the power cable leads to transmission changes of the measurement signals as well, such bending can be clearly distinguished from damage or destruction of an individual optical waveguide since the optical measurement signals transmitted in each optical waveguide can be detected and evaluated on an individual basis. This distinction can be clearly made by comparing the individual transmitted measurement signals with one another. The failure of a single optical waveguide and/or a substantial deviation of the transmission function of at least one single optical waveguide from the transmission of the other optical waveguides is a reliable indicator of the mechanical penetration of an object which has damaged the respective optical waveguide and thus the insulation. This event is detected reliably and clearly.

In some embodiments of the invention, the optical waveguides in the polymer film may have a diameter ranging from about 0.5 mm to about 2.0 mm. In some embodiments of the invention, the optical waveguides in the polymer film may have a diameter ranging from about 0.7 mm to about 1.5 mm. In some embodiments of the invention, the optical waveguides in the polymer film may have a diameter ranging from about 0.8 mm to about 1.3 mm. The distance of adjacent waveguides within the polymer film may be selected in some embodiments from about 0 mm to about 2 mm. The distance of adjacent waveguides within the polymer film may be selected in some embodiments from between about 0.1 mm to about 1 mm. The distance of adjacent waveguides within the polymer film may be selected in some embodiments from about 0.1 mm to about 0.5 mm. These embodiments may allow monitoring virtually the entire surface so that even the smallest damage can be detected.

In some embodiments of the invention, the optical waveguides are integrated in a plurality of layers in the polymer film, the optical waveguides of a first layer being arranged in staggered fashion with respect to the optical waveguides of a second layer arranged above or below the first layer. In this way, at least a section of the polymer film in the film plane is completely covered by the optical waveguides without any unwanted crosstalk between adjacent optical waveguides resulting. Such a geometric arrangement of the optical waveguides ensures that the transmission of at least one optical waveguide is interrupted when the polymer film is pierced or otherwise damaged in this area.

In some embodiments of the invention, each end of the optical waveguides can be provided with a coupling element for coupling the optical measurement signals into and/or out of the optical waveguides. This allows the measurement signals to be generated and evaluated by optical modules that can be easily connected.

In some embodiments of the invention, each of the coupling elements contains at least one region comprising a first polymer and a second polymer, the first and second polymers each having different refractive indices. Coupling elements of this type are referred to as digital coupling elements in the present disclosure. In some embodiments, said digital coupling elements allow the more efficient coupling of light from a light source, e.g. a flat emitter, as optical measurement signals into the optical waveguides perpendicular to the direction of irradiation of the flat emitter. Similarly, it is also possible to couple light from the optical waveguides into a plane perpendicular to the plane of the polymer film.

In some embodiments of the invention, the coupling elements are designed to redirect the measurement signals perpendicularly to their direction of propagation in the optical waveguides. This allows a particularly efficient coupling of the measurement signals into and out of the optical waveguides with a reduced mechanical effort. For this purpose, each waveguide can be connected at its beginning and end to a digital coupling element, which is used for the perpendicular coupling of the light into or out of the optical waveguide.

In some embodiments of the invention, the coupling elements can be manufactured as integral part of the polymer film comprising the optical waveguides, thus allowing particularly simple production. Such digital coupling elements can be imprinted or inscribed directly into multimode optical waveguides, for example using nanoimprint or microscope-projection photolithography (MPP) technology, which is a low-cost process for producing the optical insulation-monitoring device according to the invention.

In some embodiments of the invention, the coupling elements are combined to form at least one array. If the digital coupling elements, e.g. at the beginning and end of the polymer film, are arranged to form an array, the measurement signals and the transmission thereof can, in each case, be coupled into or read out of the optical waveguides at once, i.e. with an associated optical module.

In some embodiments, the coupling elements of a first array being arranged at a first end of the polymer film can be adapted to feed the measurement signals to the waveguides (illumination array) and the coupling elements of a second array being arranged at a second end of the polymer film can be adapted to receive the measurement signals (read-out array). The arrays are used to feed light into the optical waveguides of the polymer film by means of a two-dimensional interface and correspondingly to receive it by means of a two-dimensional interface. With an arrangement of the coupling elements in a separated illumination array and a separated readout array, the measurement signals can be fed by a single light source and the measurement signals can be received by a single detector, in particular a detector having a plurality of individual detection pixels, thus allowing an efficient design for insulation-monitoring.

In some embodiments of the invention, the insulation-monitoring apparatus has at least one light emitting diode (LED) for emitting the measurement signals, which is arranged in the area of the first array being adapted to feed the measurement signals, and at least one charge coupled device (CCD) camera element for reading out the measurement signals, which is arranged in the area of the second array being adapted to receive the measurement signals. In some embodiments of the invention the coupling is done by direct contacting the LED on the illumination array, and the readout with the CCD camera is done by direct contacting a light entrance surface of the CCD camera on the second array. This allows a mechanically robust and optically efficient design. If the optical insulation-monitoring device, i.e. the polymer film, is mechanically damaged, the light guidance in individual optical waveguides is interrupted and individual pixels of the CCD camera are no longer illuminated.

In some embodiments of the invention, light of a uniform wavelength or a uniform range of wavelength is supplied to the optical waveguides during operation of the insulation-monitoring apparatus. This eliminates the need for complex wavelength division multiplexing.

A cable according to the invention comprises a plurality of conductors being surrounded by insulating material and an optical insulation-monitoring device according to the invention. The polymer film of the optical insulation-monitoring device is arranged in such a way that the radial outer surface of the power cable is completely enclosed by the polymer film, at least in a longitudinal portion of the cable being monitored. In this embodiment, the polymer film is applied to the power cable in such a way that it surrounds it in its entirety.

In some embodiments of the invention, the cable may comprise an additional textile sheath, the sheath enclosing the polymer film, the insulator and the conductors in at least one longitudinal portion such that the textile sheath adjoins the polymer film. The polymer film on the power cable is protected by the textile sheath, which closely encloses the polymer film and the power cable. The textile sheath can be formed as a fabric made of synthetic fibers on the basis of polyethylene or polypropylene.

The protection of the polymer film, which can be laminated on the power cable, is provided by the textile fabric of the sheath, which is pulled over the power cable. As a material for the sheath, polyethylene braided fabric is advantageously used in some embodiments, which is mechanically very resistant and thus additionally protects the power cable from possible mechanical damage. Alternatively, the polymer film of the optical insulation-monitoring device can also be inserted into an outer rubber jacket. In these embodiments, the polymer film is selected to withstand temperatures of up to 250° C. during molding of the outer rubber jacket.

The cable according to the invention is particularly suitable as a fast-charging cable for charging electric vehicles. A charging cable for fast-charging of electric vehicles of known type can be used as a power cable and can be equipped with the optical insulation-monitoring device according to the invention. For fast charging, water cooling and/or air cooling of the fast-charging cable can be provided to reduce the cross-section and the weight of the conductors and thus the weight of the cable. In these embodiments, a measurement of a loss of water or air pressure may indicate damage to the insulation of the fast-charging cable of this type. However, it is impossible to detect very small damage to the insulation by measuring the coolant pressure. Nevertheless, such small damage to the insulation may, on the other hand, be sufficient to lead to electrical breakdowns and thus endanger people during electrical refueling. Due to the high charging power, e.g. about 500 kW, even the smallest damage to the insulation must be reliably detected, which is possible with an optical insulation-monitoring device according to the invention.

In some embodiments of the invention, the insulation-monitoring device according to the invention can be attached to the cable over a length between about 20 cm and about 500 cm. In some embodiments of the invention, the insulation-monitoring device according to the invention can be attached to the cable over a length between about 50 cm and about 300 cm. In some embodiments of the invention, the insulation-monitoring device according to the invention can be attached to the cable over a length between about 80 cm and about 250 cm. In these embodiments, the insulation-monitoring device is capable of monitoring at least a part of the cable being located in a lead-through or the part of the cable being accessible to the user, whereas other portions of the cable which are protected from contact by their location inside a housing are not monitored.

The method for producing an optical insulation-monitoring device according to the invention comprises the method steps of providing a polymer film and manufacturing optical waveguides and coupling elements onto the polymer film, wherein the optical waveguides are manufactured by imprinting and/or inscribing with a short pulse laser and/or flexographic printing and/or wherein the coupling elements are produced by means of nanoimprint printing and/or microscope projection photolithography and/or by maskless lithography.

The production of the optical insulation-monitoring device according to the invention can be carried out by means of an embossing process or more advantageously using flexographic printing and/or maskless lithography. In this way, the optical waveguides can be efficiently manufactured as multimode waveguide structures, e.g. with a width of one millimeter, over lengths of several meters. The production of the digital coupling elements at the respective ends of the optical waveguides can be carried out efficiently by either nanoimprint printing or microscope projection photolithography (MPP). Nanoimprint printing is used in a particularly advantageous way for the production since the waveguide production and the production of the digital coupling elements can be carried out in a single method step. LEDs and CCD cameras are low-cost photonic components and polymer films with integrated multimode waveguides are also low-cost components, so that very low-cost optical insulation-monitoring devices for the fast charging of electric vehicles can be produced with such an overall arrangement of an insulation-monitoring apparatus.

Special embodiments of the present invention are explained in more detail below with reference to the enclosed drawings, wherein:

DETAILED DESCRIPTION

Figure 1:
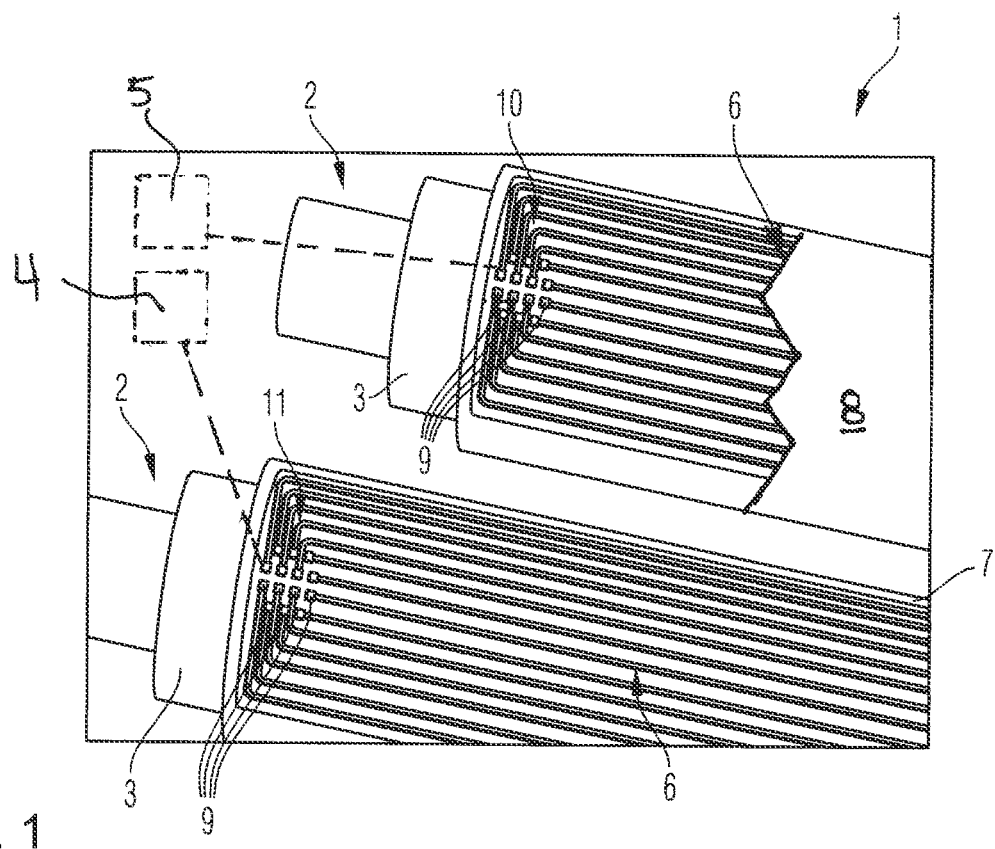
FIG. 1 shows an embodiment of a cable according to the invention having an optical insulation-monitoring device according to the invention.

FIG. 1 illustrates an embodiment of an optical insulation-monitoring device 1 according to the invention, which is applied to a power cable 2 with an insulation 3. The figure shows the two ends of the cable according to the invention. The optical insulation-monitoring device 1 has a plurality of optical waveguides 6 for the transmission of at least one optical measuring signal each, which are integrated into a polymer film 7. The polymer film 7 is laminated and/or adhered to the outer surface of the insulation 3. A coupling element 9 is provided at each end of the optical waveguides 6 to feed the optical measurement signals into the optical waveguides and to receive the optical measurement signals from the optical waveguides 6.

Assuming a cable diameter of 70 mm, the circumference of the cable is 220 mm. In this example, the number of possible optical waveguides 6 on the front side or rear side of the polymer film 7 is therefore 110 optical waveguides 6 if there is a distance of one millimeter between each optical waveguide 6 and the width of the optical waveguides 6 is one millimeter. For coupling light in or out efficiently, the individual optical waveguides 6 at the end of the polymer film 7 are combined in flat fashion into a first array 10 and a second array 11 each. Each individual waveguide end is provided with a digitally structured coupling element 9 according to FIG. 3. The size of these coupling elements 9 is in the range of one square millimeter. In FIG. 1, 14 optical waveguides 6 with integrated coupling elements 9 are arranged in this way. The number of 14 optical waveguides 6 is used for illustration only. It is apparent to one of skill in the art that the number may be much higher in real applications.

The individual coupling elements 9 of one of the two arrays 10 are intended for feeding the measurement signals to the respective waveguides, and the individual coupling elements 9 of the second array 11 are intended for receiving the measurement signals from the waveguides. In the illustrative embodiment of the optical insulation-monitoring device 1 on a charging cable, the integrated flat coupling elements 9 of the first array 10 on the top of the drawing are used to feed light and the integrated flat coupling elements 9 of the second array 11 at the lower part of the drawing are used to receive light. The first array 10 is adapted to be coupled to an LED array 5. The second array 11 is adapted to be coupled to a CCD camera 4. The power cable 3 may include a protective textile sheath 8.

When the optical insulation-monitoring device 1 according to the invention is in use, optical insulation-monitoring of even the smallest mechanical damage is carried out by the polymer film 7 being attached to the power cable 2 and having integrated waveguides 6. The polymer film 7 is arranged in such a way that the radial outer surface of the power cable 2 is completely enclosed by the polymer film 7, at least in a monitored portion of the length of the cable. For example, in the case of fast-charging cables, the area protected in this way can just be the area of the plug, i.e. where the operation takes place during electrical refueling (charging process). However, this area can also extend over several meters along the cable.

Figure 2:
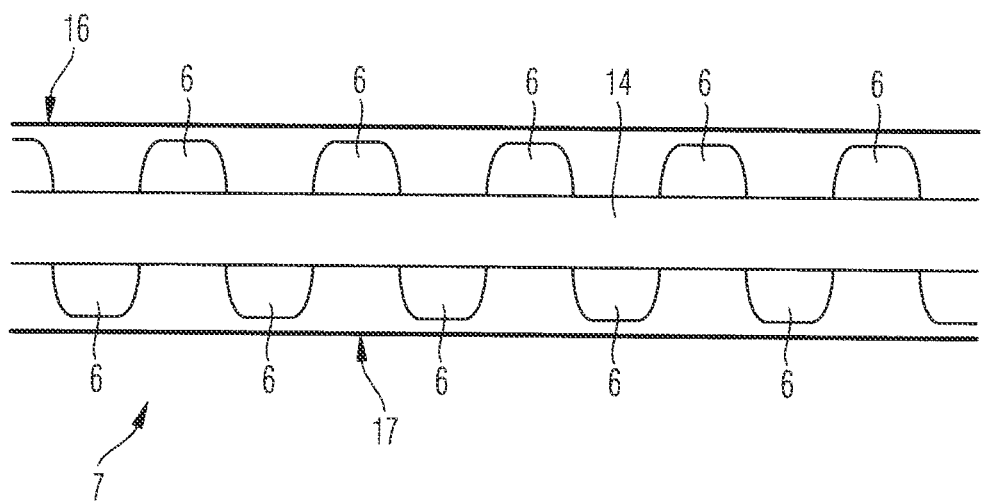
FIG. 2 shows an arrangement of staggered multimode waveguides in an optical insulation-monitoring device according to the invention.

FIG. 2 shows an arrangement of staggered optical waveguides 6 designed as multimode waveguides in an optical insulation-monitoring device according to the invention. FIG. 2 illustrates a cross-section through the polymer film 7 of the insulation-monitoring device. The optical waveguides 6 are integrated in two layers into the polymer film 7, the optical waveguides 6 of one layer being arranged in staggered fashion to the optical waveguides 6 of the other layer. Each layer is located on one side of a core area 14 of the polymer film 7, so that the individual optical waveguides 6 do not touch each other, although the area of the polymer film 7 in which the optical waveguides 6 are arranged, is completely covered by the optical waveguides 6.

The illustrated arrangement of staggered multimode waveguides 6 on the front side 16 and rear side 17 of the polymer film can be printed on a polymer film which forms the illustrated core area 14, to produce the optical insulation-monitoring device according to the invention. In order to achieve complete covering, optical multimode waveguides 6 are printed on the front side 16 and rear side 17 of the polymer film 7. The optical waveguides 6 of the front side 16 and the optical waveguides 6 of the rear side 17 each form one of two layers of the optical waveguides. The length of the optical waveguides 6 can be up to several meters, the width of the optical waveguides 6 is typically one millimeter. The arrangement of the optical waveguides 6 is such that they are arranged in overlapping manner. If the polymer film 7 is damaged, for example by the penetration of a thin nail, the selected arrangement guarantees that at least one waveguide 6 is destroyed and that the light propagation, i.e. the transmission of the measurement signal, is interrupted.

Figure 3:
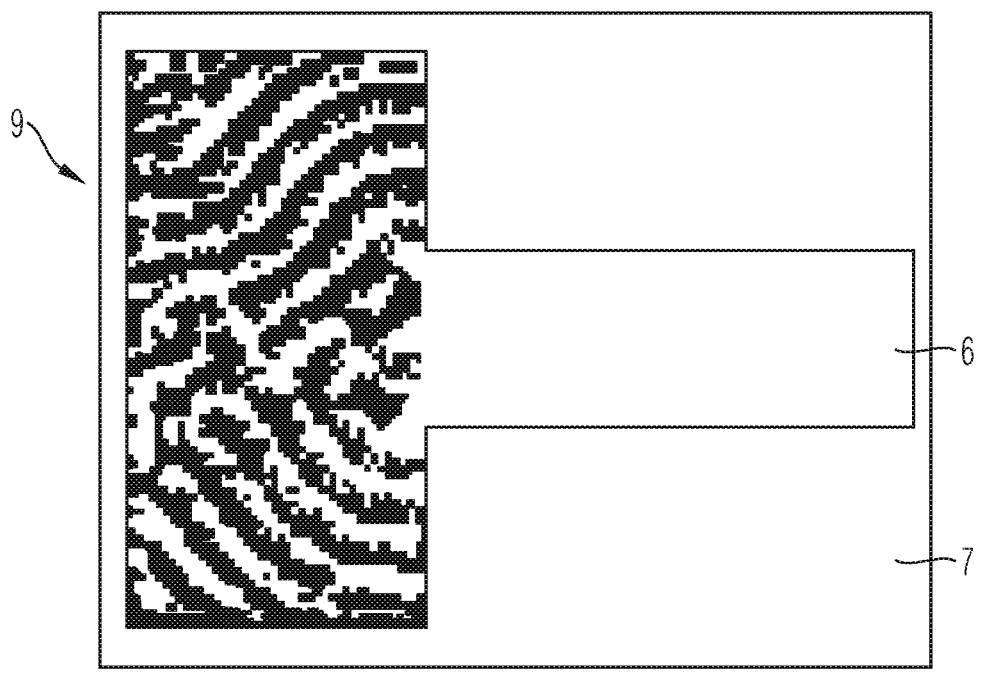
FIG. 3 shows an embodiment of a digital coupling element at one end of the optical waveguide of an optical insulation-monitoring device according to the invention.

FIG. 3 illustrates an embodiment of a digital coupling element 9 at one end of an optical waveguide 6 of an optical insulation-monitoring device according to the invention, as described with respect to FIG. 1. The coupling element 9 is formed from a region of the polymer film 7 that includes a first polymer and a second polymer, the first and second polymers differing with regard to their respective refractive indices. The illustrated embodiment of a digital coupling element 9 allows for coupling of at least 75% of the light of a light source such as an LED into the multimode waveguide for a wavelength of 850 nm. The two different areas are identified in the figure as a wave-like structure within the coupling element 9.

The coupling element 9 represents an optical component comprising a substrate which contains or consists of a first polymer having a first refractive index, wherein regions having a second refractive index are formed. Thus, the optical component comprises at least one optical metamaterial containing a plurality of individual pixels each comprising a region having the first or second refractive index. In this way, the pattern illustratively shown in the figure is created in the area of the coupling element. The areas of the polymer film that contain different polymers are thus formed by the different pixels.

For the purposes of the present description, a metamaterial is defined as a material comprising an artificially produced structure with an electrical permittivity and magnetic permeability, which are decisive for the refractive index and deviate from the values common in nature. This is achieved by small structures which are formed inside the metamaterial. In the present case, the metamaterial comprises a plurality of individual pixels or voxels each comprising a region having the first or second refractive index. The pixels can be arranged periodically, so that virtually a checkerboard pattern results, in which pixels of one and the other refractive index are arranged alternately, the pixel sequence in the lines below being staggered by one period. This is how the wave-like structure shown is created. In other embodiments of the invention, the pixels can be arranged in a predefinable, at a first glance arbitrary pattern similar to an optical QR code, so that a desired predefinable effect of the metamaterial on optical signals results.

Figure 4:
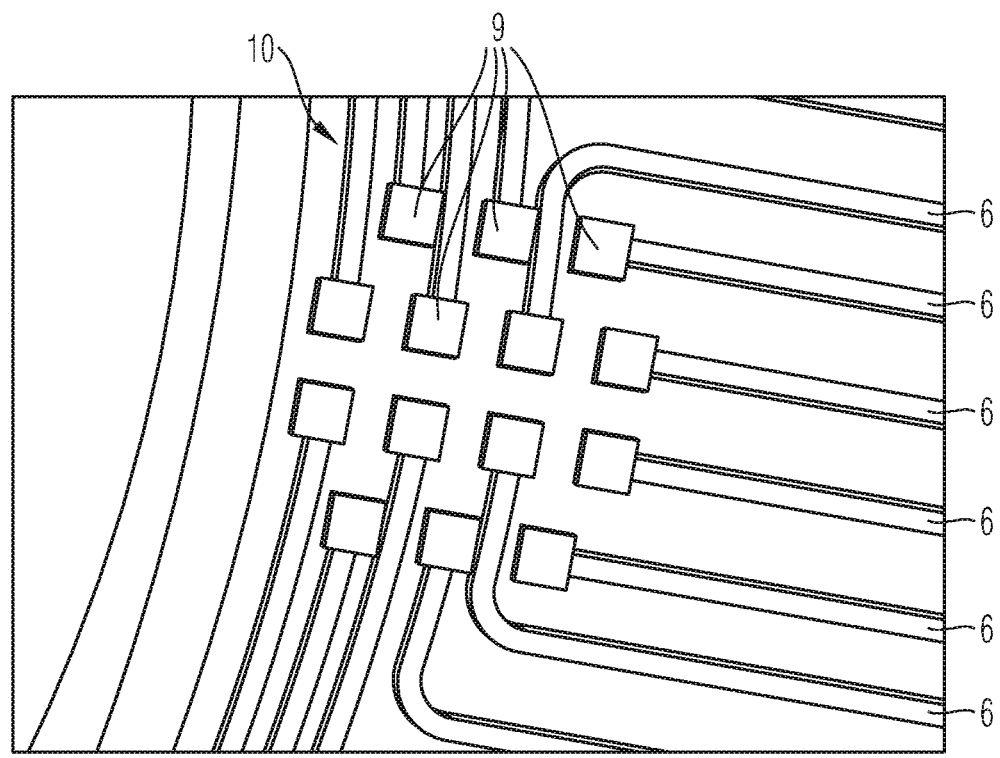
FIG. 4 shows an illumination and/or readout array of the optical insulation-monitoring device according to FIG. 1 in greater detail.

FIG. 4 illustrates an exemplary embodiment of an illumination and/or readout array 10 in greater detail. The arrangement of the coupling elements 9 in the array 10 is chosen in a chessboard pattern. In this way, the individual coupling elements 9 can be assigned to individual pixels or pixel ranges of a CCD camera element being arranged adjacent to the array 10.

The coupling elements 9 of an array 10 used for feeding optical signals are illuminated by a flat emitter in an insulation-monitoring apparatus according to the invention, e.g. by means of an LED. The transmitted light fed as a measurement signal from the coupling elements on the opposite side of the cable, e.g. in the area of the handle of a fast-charging cable, is detected by a CCD camera contacting the readout array. If the light transmission in one of the optical waveguides 6 is interrupted by mechanical damage, no light is emitted by the associated digital coupling element 9 of the corresponding optical waveguide 6 and therefore the pixels on the CCD camera are no longer illuminated.

For continuous evaluation, the CCD camera readout obtained from an undamaged cable can be stored and then be used as a reference during operation of the cable. A mechanical damage, i.e. a defect in the insulation of the fast-charging cable, clearly leads to non-illuminated camera pixels and can therefore be clearly distinguished from fluctuations in intensity, e.g. caused by bending of the cable. Both the LED and the CCD camera can be easily integrated into the cable due to the small geometrical designs of the components. The entire system does not require any complicated optical adjustment as both illumination and readout take place in flat geometrical arrangement. The digital coupling elements on the rear side of the polymer film, e.g. in the case of an embodiment according to FIG. 2, are illuminated and read out through the polymer film.

While the disclosure has been described in this detailed description, the same is to be considered as exemplary and not restrictive in character, it being understood that only illustrative embodiments thereof have been described and that changes and modifications that come within the spirit of the disclosure are desired to be protected. If the claims and the above description define "first" and "second" features, this designation is used to distinguish between two similar features without determining a ranking. The following claims are to be understood in such a way that a stated feature is present in at least one embodiment of the invention. This does not exclude the presence of additional features.

What is claimed:

1. A cable comprising at least one conductor being surrounded by at least one insulation,
   said cable comprising further an optical insulation-monitoring device, said optical insulation-monitoring device comprising a plurality of optical waveguides each having a light receiving end and a light emitting end and being adapted to transmit a respective optical measurement signal from said light receiving end to said light emitting end, at least one coupling element at each end of at least one optical waveguide of the plurality of optical waveguides, said at least one coupling element at each end being adapted to feed the optical measurement signal into the at least one optical waveguide and to receive the optical measurement signal from the at least one optical waveguide, wherein the optical waveguides are integrated into a polymer film and the polymer film is arranged in such a way that a radial outer surface of the cable is surrounded by the polymer film in at least one longitudinal portion of the cable and the at least one coupling element at each end contains at least one region being located on the polymer film, said region comprising a first polymer and a second polymer, the first and second polymers each having different refractive indices.

2. The cable according to claim 1, wherein the optical waveguides are arranged in the polymer film in several layers, the optical waveguides of one layer being arranged in a staggered fashion with respect to the optical waveguides of another layer.

3. The cable according to claim 1, wherein the at least one coupling element at each end are adapted to redirect the optical measurement signals perpendicularly to their direction of propagation in the optical waveguides.

4. The cable according to claim 1, wherein the at least one coupling element at each end are formed as an integral part of the polymer film comprising the optical waveguides.

5. The cable according to claim 1, wherein the at least one coupling element at each end are combined to form at least one array.

6. The cable according to claim 5, wherein the at least one coupling element of a first array are arranged at a first end of the polymer film, said at least one coupling element of said first array being adapted to feed the measurement signals to the optical waveguides and the at least one coupling element of a second array being arranged at a second end of the polymer film, said at least one coupling element of said second array being adapted to receive the measurement signals.

7. The cable according to claim 6, comprising at least one light emitting diode being adapted to emit the measurement signals, said light emitting diode being integrated into the cable in an area of the first array.

8. The cable according to claim 6, comprising further at least one charge coupled device camera, said charge coupled device camera being integrated into the cable in an area of the second array.

9. The cable according to claim 7, wherein said light emitting diode is designed to supply light of a uniform wavelength to the optical waveguides.

10. A cable comprising at least one conductor being surrounded by at least one insulation, said cable comprising further an optical insulation-monitoring device, said insulation-monitoring device comprising a plurality of optical waveguides each having a light receiving end and a light emitting end and being adapted to transmit a respective optical measurement signal from said light receiving end to said light emitting end, wherein the optical waveguides are integrated into a polymer film, wherein the optical waveguides are arranged in the polymer film in a plurality of layers, the optical waveguides of one layer of the polymer film being arranged in a staggered fashion with respect to the optical waveguides of another layer of the polymer film, and the polymer film is arranged in such a way that a radial outer surface of the cable is surrounded by the polymer film in at least one longitudinal portion of the cable, wherein each optical waveguide contains at least one region located on the polymer film, said region comprising a first polymer and a second polymer, the first and second polymers each having different refractive indices.

11. The cable according to claim 10, comprising further at least one coupling element at each end of at least one optical waveguide, said at least one coupling element at each end being adapted to feed the optical measurement signal into the at least one optical waveguide and to receive the optical measurement signal from the at least one optical waveguide.

12. The cable according to claim 11, wherein the at least one coupling element at each end are adapted to redirect the optical measurement signals perpendicularly to their direction of propagation in the optical waveguides.

13. The cable according to claim 11, wherein the at least one coupling element at each end are formed as an integral part of the polymer film comprising the optical waveguides.

14. The cable according to claim 11, wherein the at least one coupling element at each end are combined to form at least one array.

15. The cable according to claim 14, wherein the at least one coupling element of a first array are arranged at a first end of the polymer film, said at least one coupling element of said first array being adapted to feed the measurement signals to the optical waveguides and the at least one coupling element of a second array being arranged at a second end of the polymer film, said at least one coupling element of said second array being adapted to receive the measurement signals.

16. The cable according to claim 15, comprising at least one light emitting diode being adapted to emit the measurement signals, said at least one light emitting diode being arranged in an area of the first array.

17. The cable according to claim 15, comprising further at least one charge coupled device camera, said at least one charge coupled device camera being arranged in an area of the second array.

18. The Cable according to claim 10, comprising further a textile sheath, said textile sheath enclosing said at least one conductor being surrounded by the at least one insulation and the polymer film in an adjoining fashion.

* * * * *